United States Patent [19]

Pamiello

[11] Patent Number: 4,495,515

[45] Date of Patent: Jan. 22, 1985

[54] ELECTRICALLY ISOLATING TWO PIECE MOUNTING WASHER ARRANGEMENT

[75] Inventor: Gani Pamiello, Little Falls, N.J.

[73] Assignee: AT&T Bell Laboratories, Murray Hill, N.J.

[21] Appl. No.: 401,943

[22] Filed: Jul. 26, 1982

[51] Int. Cl.³ ..................... H01L 23/02; H01L 23/12
[52] U.S. Cl. .................... 357/81; 357/74; 174/16 HS; 174/138 G; 339/112 R; 361/388; 165/80 B
[58] Field of Search ............. 357/81, 74; 339/112 L, 339/112 R, 77, 208, 210; 361/386, 387, 388; 174/16 HS, 138 G; 165/80 B, 185

[56] References Cited

U.S. PATENT DOCUMENTS

| | | | |
|---|---|---|---|
| 3,261,904 | 7/1966 | Wulc | 357/81 |
| 3,391,242 | 7/1968 | Sudges | 357/81 |
| 3,641,474 | 2/1972 | Owens | 339/17 L |
| 3,763,403 | 10/1973 | Lootens | 317/234 R |
| 4,038,678 | 7/1677 | Gottbreht et al. | 357/81 |
| 4,076,364 | 2/1978 | Kuo | 339/208 |

FOREIGN PATENT DOCUMENTS 76875  8/1948  Czechoslovakia .................. 339/208

Primary Examiner—Andrew J. James
Assistant Examiner—Jerome Jackson
Attorney, Agent, or Firm—Alfred G. Steinmetz

[57] ABSTRACT

A mounting washer arrangement for a new type power transistor package comprises two interlocking washers. A first mounting washer part of heat sinking material fits under the transistor body; a second mounting washer part of electrically insulating material interlocks with the first mounting washer part and fits under a terminal lug of the transistor. Together the two mounting washer parts provide economical heat sinking and electrical insulation. The interlocking arrangement prevents cracking and twisting of the two mounting washer parts when the transistor is firmly secured by torquing anchoring screws to the chassis.

12 Claims, 4 Drawing Figures

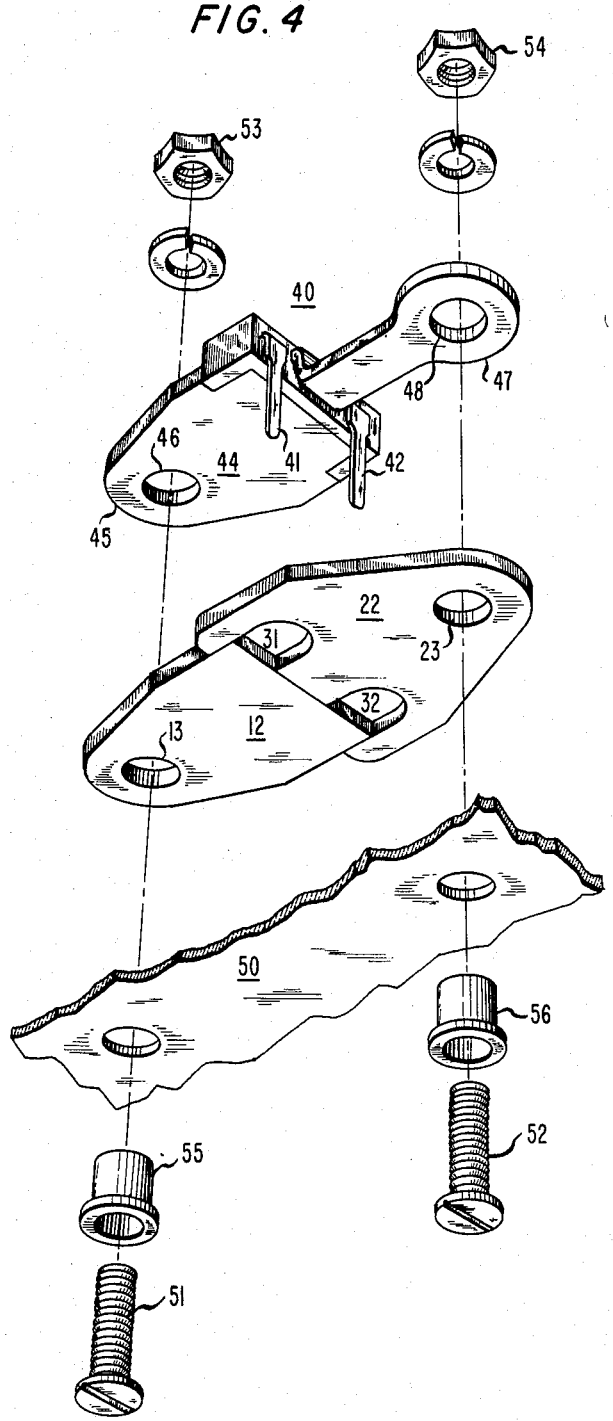

ELECTRICALLY ISOLATING TWO PIECE MOUNTING WASHER ARRANGEMENT

TECHNICAL FIELD

This invention is concerned with a physical mounting arrangement for a power transistor package and, more particularly, to a new conbination mounting system providing the desired isolation and thermal properties for a new power transistor package.

BACKGROUND OF THE INVENTION

The reliability of a power transistor is largely determined by thermal considerations. Power dissipation in the junction regions, due to operation of the transistor, generates heat which accelerates failure mechanisms of the transistor thereby shortening its useful life. Useful life of the transistor can be extended by a transistor mounting scheme which provides a heat sink arrangement to conduct heat away from the transistor package and hence reduce junction temperatures. These mounting assemblies must also provide electrical isolation between the body of the transistor package and the apparatus or chassis on which the transistor is mounted.

This mounting arrangement, at present, typically consists of a single washer conforming to the outline of the transistor package body such as the standard TO3 package and is constructed of a material having the necessary electrical and thermal properties. Beryllia, also known as Beryllium oxide (BeO), is a material prossessing both good electrical isolation propeties and good thermal conductivity. A washer made of Beryllia is situated between the transistor and the apparatus to which it is mounted. The mounting is secured by mounting fasteners passing through holes in the transistor package and matching holes in the washer. Silicon grease, a thermally conductive medium or an equivalent heat conductive compound, is inserted between the washer and the transistor package to coat both surfaces and improve thermal conduction between adjacent surfaces that are generally not entirely flat.

It is apparent, therefore, from the foregoing that a successful mounting scheme for power transistors must take into account the thermal properties of the transistor as well as its electrical properties. Any mounting scheme selected must further consider the mechanical properties of the mounting system, cost of materials and ease of installation.

SUMMARY OF THE INVENTION

Therefore in accord with the principles of the invention, a mounting scheme for a power transistor embodied in a new package utilizes a two piece assembly to provide appropriate electrical isolation and thermal conductivity properties, while securing the power transistor package to a circuit chassis. One part of the mounting assembly, constructed of material having a low heat resistance thermally conductive and high relative permittivity electrical isolating material, is placed under and conforms to the body outline shape of the power transistor package. A second part of the mounting assembly, make of less expensive material to provide high relative permittivity electrical isolation only, interlocks with the first part of the mounting assembly. As mated together, the two pieces of the mounting assembly provide anchoring holes that align with anchoring holes in electrodes or lugs of the power transistor package. The interlocking feature of the two piece assembly prevents twisting and cracking of the two pieces when the anchoring screws fastening the transistor to a circuit chassis are tightened. Accordingly, an effective mounting assembly is achieved while reducing material costs and maintaining ease of assembly.

BRIEF DESCRIPTION OF THE DRAWING

The invention may be readily understood by referring to the following specification and the accompanying drawing in which:

FIG. 4 is an exploded pseudo pictorial representation of a power transistor mounting arrangement utilizing the two piece mounting assembly arrangement according to the invention.

DETAILED DESCRIPTION

Figure 1:
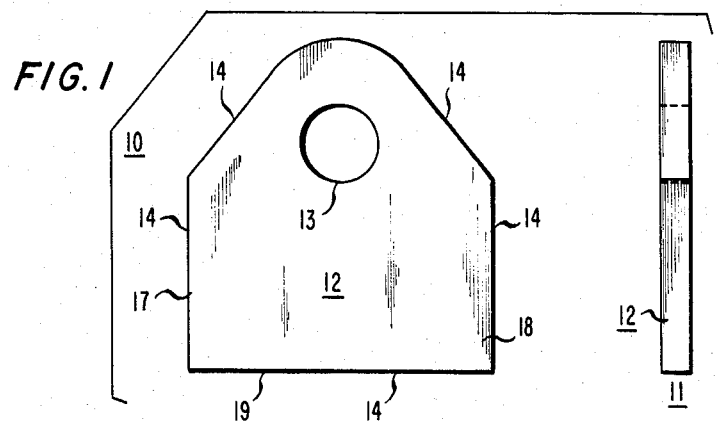
FIG. 1 is an orthogonal projection of a heat sink structure which is part of the transistor mounting assembly.

A planar 10 and side view 11 of the heat sink portion 12 of the mounting washer assembly is shown in FIG. 1. The heat sink structure 12 includes a hole 13 through which an anchoring screw passing through a transistor securing lug and continues through to the circuit chassis to securely fasten the transistor and heat sink washer to the chassis. A perimeter outline 14 of the heat sink washer conforms to the actual body perimeter outline of the power transistor package. This perimeter outline is a five sided figure having the form of a rectangle joined on one side by an isosceles triangle which form is identical to the body outline shape of the bottom of the transistor package. The thermal and electrical properties of the washer must be such that the power transistor is electrically insulated from the circuit chassis (which normally functions as a heat sink) while maintaining good heat transfer characteristics from the transistor package to the chassis. A suitable material for this washer is Beryllium oxide (BeO) which insulates electrically like a ceramic and conducts heat like a metal.

Figure 2:
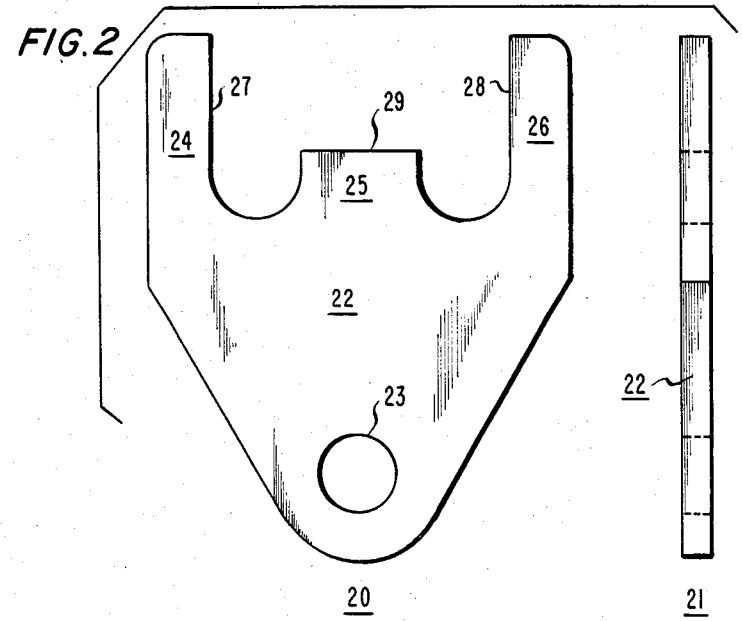
FIG. 2 is an orthogonal projection of a guide or electrically isolating structure portion of the transistor mounting assembly.

A planar 20 and side view 21 of the second electrical isolating part 22 of the mounting washer assembly providing only electrical insulation is shown in FIG. 2. It may be made of an epoxy glass material which provides the necessary electrical insulation characteristic and which is considerably less expensive than Beryllium oxide.

The electrically isolating part 22 has an anchoring hole 23 at one end to accept anchoring screws passing through a mounting lug of the transistor. The opposite end as three projections 24, 25 and 26 in the form of an E. The two outer projections 24 and 26 have inner edges 27 and 28 which mate with outer edges 17 and 18 of the heat sink washer 12, shown in FIG. 1, and the center leg 25 has an end 29 which abuts against one end edge 19 of the heat sink washer 12 so that the two assembly parts are substantially in fixed dimensional and angular relation to each other when they are mated together.

Figure 3:
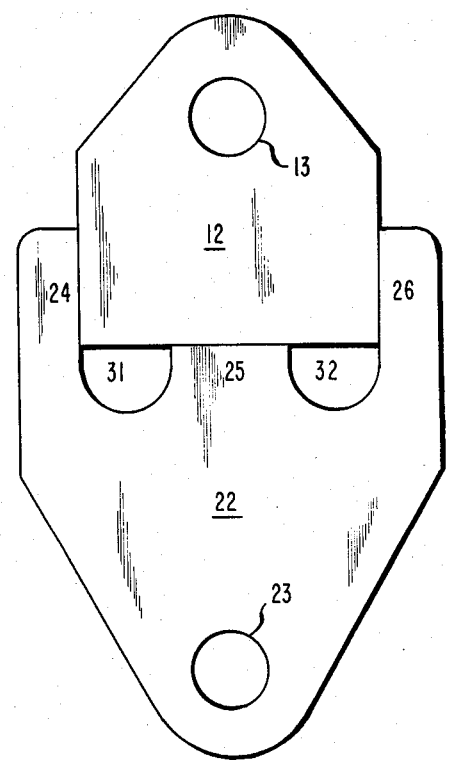
FIG. 3 is a planar view of the two mounting assembly parts as they are positioned together for use.

The two mounting washer pieces 12 and 22 are joined or mated with each other as shown in FIG. 3. As shown, the two outer legs 24 and 26 of the electrically isolating washer in combination with the third middle leg 25 mate with and abut against the rectangular shaped end of the heat sink washer to control the dimensional and angular relation between the two parts when they are so joined together. Between the legs 24, 25 and 26 are semicircular shaped apertures 31 and 32, which exist after the two parts 12 and 22 are joined and which permit electrodes of the transistor to pass through the washer assembly to connecting junctions in the chassis.

The interlocking arrangement of the mounting washer parts controls the dimensional relation between the two anchoring holes 13 and 23 which permit anchoring screws passing through the mounting lugs of the transistor to pass through the washer assembly to the chassis. The interlocking arrangement preserves the angular relation of the two mounting washer parts 12 and 22 and yet has sufficient flexibility between the two parts so that tightening of the anchoring screws to secure the transistor to the chassis will not cause relative twisting or cracking in the mounting washer parts.

A typical mounting arrangement utilizing the new two piece washer assembly is shown in FIG. 4. The transistor package 40 shown in FIG. 4 has two electrodes, the base 41 and the emitter 42, which passes through the electrode apertures 31 and 32 of the mounting washer assembly. The bottom surface portion 44 of the transistor package body is metallic for assuring good heat conduction from the transistor junctions to the heat sink washer 12. The back part of the metallic under body of the transistor package forms a lug 45 containing an anchoring hole 46 which accepts an anchor screw to secure the transistor to the chassis. The collector electrode 47 of the transistor is used to form a second lug which includes an anchoring hole 48 to coincide with the anchor hole 23 in the insulating part of the mounting washer assembly.

The particular transistor package case shown in FIG. 4 has been designed as a replacement for the conventional TO3 transistor case. It has been found that use of the existing single washer designed for the TO3 case is not satisfactory because stress, due to the tightening of the anchoring screws, often causes the washer to fracture. Additionally, the single mounting washer formerly used with the TO3 case must be made entirely of the expensive combined electrical insulation and heat conduction material. Accordingly, the new mounting washer assembly disclosed herein requires only that the mounting washer portion under the body of the new transistor package have the desired heat conduction properties.

The mounting washer assembly is coupled as shown in FIG. 4 and the heat sink washer portion is covered with silicon grease or other heat conductive compound to improve coupling of adjacent heat conductive surfaces. Only the heat sink portion must be covered with silicon grease for thermal conductivity, and this is a further expense saving improvement over utilizing the conventional washer originally designed for the TO3 case which must be totally covered with thermal grease. The transistor package 40 is mounted on top of the washer assembly, as shown, and the anchoring screws 51 and 52 are applied through washers 55 and 56, the anchoring holes, attached to nuts 53 and 54 and torqued to secure the transistor package and mounting washer assembly to the chassis 50 which acts as a major heat sink component for heat generated within the transistor.

As is apparent from the foregoing description, this two piece mounting arrangement reduces the amount of heat sink material and silicon grease or similar heat conductive compound required as compared to the conventional mounting washer and prevents cracking and splitting in the mounting washers due to tightening of the anchoring screws while, at the same time, providing the needed electrical isolation from the chassis and maintaining the necessary heat transfer characteristics between the transistor package and the chassis.

What is claimed is:

1. A mounting arrangement for mounting a power transistor package on a circuit chassis comprising;

a first mounting washer constructed of a material having high relative permittivity electrical insulating properties and low thermal resistance heat conduction properties and futher having a perimeter outline shape conforming to a perimeter outline of a body of the power transistor package to be mounted on top of the first mounting washer and further including an anchoring hole in register with a first anchor hole of the transistor package, a second mounting washer constructed of a material having high relative permittivity, electrical insulating properties and having an anchoring hole in register with an anchoring hole in an electrode of the transistor package and further including means for positively engaging the first mounting washer, said means for engaging operative to prevent relative twisting of the first and second mounting washers and further operative to maintain the anchoring holes a fixed distance apart, the first and second mounting washers being mounted coplanar with each other and positioned between the power transistor and the circuit chassis with the first mounting washer located exclusively under the body of the power transistor package and the second mounting washer under the electrode of the power transistor.

2. A mounting arrangement as defined in claim 1 wherein said means for positively engaging comprises;

three legs on an end of the second mounting washer with two outer legs including interior sides engaging opposite exterior sides of the first mounting washer, respectively, to prevent relative twisting and a middle leg between the two outer legs and shorter than the two outer legs having an end portion abutting against a side of the first mounting washer to establish a fixed distance between the anchoring holes of the first and second mounting washers.

3. A mounting arrangement for a power transistor package as defined in claim 2 wherein passageways for power electrodes of the power transistor package are formed in the mounting washer assembly from semicircular hollows located between legs of the second mounting washer and an edge of the first mounting washer.

4. A mounting arrangement for a power transistor package as defined in claim 3 wherein said first mounting washer has a high electrical resistivity with a dielectric constant exceeding six and low resistivity to thermal conduction.

5. A mounting arrangement for mounting a power transistor on a circuit chassis comprising:

the power transistor including a semiconductor body including a securing lug with a first anchor hole and at least a power electrode extending away from the semiconductor body and including a second anchor hole, a first mounting washer shaped to conform to an outline of the semiconductor body of the power transistor and constructed of a material to provide electrical isolation and high thermal conductivity, the first mounting washer including a hole to accept an anchoring screw passing through an anchoring hole in the securing lug on one side of the body of the transistor, a second mounting washer constructed of a material to provide electrical isolation and being E shaped at one end with two outer legs dimensioned to permit inner sides thereof to positively engage outer sides of the first mounting washer and further including a center leg resting against an end of the first mounting washer, the second mounting washer including a hole to accept an anchoring screw passing through the second anchor hole in the power electrode of the power transistor, whereby the positive engagement of the first and second mounting washers stabilize a relative position of the two anchoring holes and further prevent twisting when the anchoring screws are torqued tight to secure the body of the transistor to a circuit chassis, the first and second mounting washers being positioned on the circuit chassis coplanar with each other and the power transistor being mounted on top of the first and second mounting washer so that the first mounting washer is exclusively under the semiconductor body and the second mounting washer is under the power electrode.

6. A mounting arrangement for a power transistor as defined in claim 5 further including apertures for passage of electrodes of the power transistor formed out of two semicircular openings formed between the two outer legs and the center leg.

7. A mounting arrangement for a power transistor as defined in claim 6 wherein the first mounting washer is constructed of a Beryllium oxide material and the second mounting washer is constructed of an epoxy glass filled material.

8. A two piece mounting washer arrangement for a power transistor package having a semiconductor body including a securing lug with a first anchor hole and at least a power electrode extending away from the body and including a second anchor hole comprising:

a first mounting washer including a first hole for an anchor screw constructed of heat sinking material and having an outline conforming to a bottom plane body shape of the transistor's semiconductor body, a second mounting washer constructed of electrical insulating material having a second hole for an anchor screw and further including means for interlocking with the first washer so that the first and second holes are aligned with the first and second anchor holes of the power transistor and the means for interlocking further preventing relative twisting of the first and second washers when the transistor package is secured to a chassis with anchoring screws, the first and second mounting washers being positioned coplanar with each other with the first mounting washer located exclusively under the semiconductor body and the second mounting washer located substantially under the power electrode.

9. A two piece mounting washer arrangement for a power transistor package as defined in claim 8 wherein said means for interlocking includes first, second and third legs at one end of the second mounting washer having an E shape and with two outer first and third legs dimensioned to permit inner sides thereof to positively engage outer sides of the first mounting washer and a middle second leg resting against an end of the first mounting washer.

10. A two piece mounting washer arrangement for a power transistor package as defined in claim 9 whereby the first, second and third legs have spaces between the first and second leg and the second and third leg, respectively, to provide apertures for transistor electrodes.

11. A power transistor mounting system comprising:
a power transistor including a semiconductor body package having a lug with a first securing hole and at least one electrode extending beyond the body package and having a second securing hole to accept an anchor screw, a circuit chassis having planar surface on which the transistor is to be mounted, a mounting washer arrangement comprising:
a first mounting washer component shaped to conform to the outline of the semiconductor body package and being located exclusively between the body package and the planar surface, a second mounting washer component including means for interlocking with the first washer component for preventing relative twisting of the first and second washer components and being located between the one electrode and the planar surface, the first and second mounting washer components being interlocked together and further being mounted coplanar with each other and positioned between the power transistor and the planar surface, and further including first and second anchor holes respectively; the first and second securing holes of the power transistor being in register with the first and second anchor holes of the first and second mounting washer, the first mounting washer being constructed of a material to provide good heat transmission, the second mounting washer component being constructed of a material to provide electrical isolation.

12. A mounting system arrangement for mounting a transistor on a chassis comprising:
a chassis having two attachment holes there through
a transistor including a transistor semiconductor body and first, second and third electrodes, the transistor's semiconductor body having a metallic bottom to facilitate heat transfer, the metallic bottom being extended in one direction in order to form a first lug containing a first anchor hole the first electrode being insulated from the metallic bottom and extending from a side opposite a side containing the first lug, the first electrode including a second anchor hole and further being substantially on a common plane with the metallic bottom, a mounting washer assembly comprising:
a first mounting washer constructed of a material having high relative permittivity electrical insulating properties and low thermal resistance heat conduction properties and further having a perimeter outline shape conforming to a perimeter outline of the metallic bottom of the power transistor semiconductor body and including a third anchoring hole, a second mounting washer constructed of a material having high relative permittivity, electrical insulating properties and including a fourth anchoring hole, the first and second mounting washer being positioned on the chassis so that they are coplanar with each other the second mounting washer including means for positively engaging the first mounting washer so that the third and fourth anchor holes are in register with the first and second anchor holes, the means for positively engaging comprising:

three legs on an end of the second mounting washer with two outer legs including interior sides engaging opposite exterior sides of the first mounting washer, respectively, to prevent relative twisting and a middle leg between the two outer legs and shorter than the two outer legs having an end portion abutting against a side of the first mounting washer to establish a fixed distance between the third and fourth anchoring holes of the first and second mounting washers, and semicircular hollows located between legs of the second mounting washer and an edge of the first mounting washer, the semicircular hollow forming passageways for the second and third electrodes of the transistor, and the transistor being mounted on top of the first and second mounting washers with the first and second anchor holes being in exclusive register with the third and fourth anchor holes and the metallic bottom being in exclusive register with the first mounting washer.

* * * * *